United States Patent [19]

Day et al.

[11] Patent Number: 5,439,766
[45] Date of Patent: * Aug. 8, 1995

[54] COMPOSITION FOR PHOTO IMAGING

[75] Inventors: Richard A. Day, Whitney Point, N.Y.; Donald H. Glatzel, New Milford, Pa.; John R. Mertz; Joel L. Roth, both of Endicott, N.Y.; David J. Russell; Logan L. Simpson, both of Apalachin, N.Y.

[73] Assignee: International Business Machines Corporation, Armonk, N.Y.

[*] Notice: The portion of the term of this patent subsequent to Jun. 25, 2008 has been disclaimed.

[21] Appl. No.: 976,115

[22] Filed: Nov. 13, 1992

Related U.S. Application Data

[63] Continuation-in-part of Ser. No. 793,889, Nov. 18, 1991, Ser. No. 632,032, Dec. 21, 1990, abandoned, and Ser. No. 632,066, Dec. 21, 1990, abandoned, said Ser. No. 632,032, and Ser. No. 632,066, each is a continuation of Ser. No. 318,536, Mar. 3, 1989, Pat. No. 5,026,624, which is a continuation-in-part of Ser. No. 292,173, Dec. 30, 1988, Pat. No. 4,940,651.

[51] Int. Cl.$^6$ ............................................. G03C 1/725
[52] U.S. Cl. ...................................... 430/18; 430/270; 430/271; 430/272; 430/280; 522/31; 522/170; 523/401; 523/444
[58] Field of Search ................. 430/18, 270, 271, 272, 430/280; 522/31, 170; 523/401, 444

[56] References Cited

U.S. PATENT DOCUMENTS

| | | |
|---|---|---|
| 3,794,576 | 2/1974 | Watt . |
| 3,817,906 | 6/1974 | Tsukiok . |
| 4,058,401 | 11/1977 | Crivello . |
| 4,069,054 | 1/1978 | Smith . |
| 4,069,055 | 1/1978 | Crivello . |
| 4,081,276 | 3/1978 | Crivello . |
| 4,138,255 | 2/1979 | Crivello . |
| 4,175,963 | 11/1979 | Crivello . |
| 4,246,147 | 1/1981 | Bakos et al. . |
| 4,250,053 | 2/1981 | Smith . |
| 4,279,985 | 7/1981 | Nonogaki et al. . |
| 4,351,708 | 9/1982 | Berner et al. . |
| 4,442,197 | 4/1984 | Crivello . |
| 4,544,623 | 10/1985 | Audykowski et al. . |
| 4,546,067 | 10/1985 | Irving et al. . |
| 4,548,890 | 10/1985 | Dickinson et al. . |
| 4,548,895 | 10/1985 | Irving et al. . |
| 4,578,425 | 3/1986 | Santorelli . |
| 4,624,912 | 11/1986 | Zweifel et al. . |
| 4,659,649 | 4/1987 | Dickinson et al. . |
| 4,684,671 | 8/1987 | Tsuchiya et al. . |
| 4,693,961 | 9/1987 | Bauer . |
| 4,735,891 | 4/1988 | Budde et al. . |
| 4,940,651 | 7/1990 | Brown et al. . |
| 5,026,624 | 6/1991 | Day et al. . |

OTHER PUBLICATIONS

"Curing Agents and Modifiers," *Epoxy Resins, Chemistry and Technology,* Second Edition, by Clayton A. May Hi-Tek Polymers, CMD W55-5003 Epoxy Resin Dispersion, Oct. 1988.

*Primary Examiner*—Joseph L. Schofer
*Assistant Examiner*—John M. Cooney, Jr.
*Attorney, Agent, or Firm*—Calfee Halter & Griswold

[57] ABSTRACT

According to the present invention, good image resolution of a cationically polymerized epoxy based coating, such as a solder mask or dielectric or etch resist, is provided by combining a cationically polymerized epoxy based coating with conventional epoxy glass substrates cured with a curing agent that does not produce basic reaction products. Preferably, the coating is photoimagable. The method for making the same is also provided. The coating material includes an epoxy resin system comprising between from about 10% to about 90%, preferably about 28% to about 57% by weight of a polyol epoxy resin, and from about 10% to about 90%, preferably about 43% to 72% by weight, of a brominated epoxy resin. Optionally, a polyepoxy resin or an epoxy creosol novolak resin is added to the resin system. The polyepoxy resin may be added from an effective amount up to less than 90% of the resin system; the epoxy creosol novolak may be added from an effective amount up to about 80 pph.

22 Claims, No Drawings

COMPOSITION FOR PHOTO IMAGING

CROSS REFERENCE TO RELATED APPLICATIONS

This is a continuation-in-part of copending application Ser. No. 07/793,889, filed Nov. 18, 1991, and C.I.P. application Ser. Nos. 07/632,032, filed Dec. 21, 1990, now abandoned and 07/632,066, filed Dec. 21, 1990, now abandoned, both of which are continuations of application Ser. No. 07/318,536, filed Mar. 3, 1989, which application issued as U.S. Pat. No. 5,026,624 on Jun. 25, 1991; this latter application is also a continuation-in-part of application Ser. No. 07/292,173, now U.S. Pat. No. 4,940,651 issued Jul. 10, 1990, filed Dec. 30, 1988.

BACKGROUND OF THE INVENTION

There are many different instances where photoimagable compositions are utilized in various industrial processes, such as circuit board manufacturing. For example, photoimagable compositions are utilized as solder masks or as a dielectric, or as both by applying the photoimagable composition to the underlying substrate such as conventional epoxy glass laminate. Thereafter photolithographic techniques are employed to reveal various underlying structures on the board while masking others so that solder may be applied to the exposed structures. During the solder applying process the solder will adhere to the exposed underlying components and be prevented from adhering where the remaining material operates as a solder mask.

In a quest for miniaturization, attempts have been made to condense more lines and structures onto the circuit board. The lines and structures must therefore be finer and closer together. The proximity of lines and structures creates a variety of problems; for example, in soldering chips onto pads, care must be taken to protect and isolate the conductive structures so as to prevent solder bridges from forming between structures. However, as the area to be protected by a solder mask decreases in size, conventional solder masks often demonstrate an inability to adhere to conventional epoxy glass substrates, such as "FR4 boards". If the mask detaches, thereby exposing underlying area, solder is likely to spill onto the unprotected area and form an unwanted bridge between the structure being soldered and the exposed structure thereby creating a short circuit. In an effort to improve the adherence between the solder mask and the structures to be protected, those in the art have sought to improve the solder mask composition.

However, adherence to the substrate is not the only consideration in formulating a solder mask. It is necessary that the solder mask material be formulated such that it can be applied by the appropriate methods; for example curtain coating and screen coatings require certain rheological properties for effective coating. Further, the solder mask must provide efficient transmission of the light or other exposing radiation so as to photolyze the photoinitiator through whatever thickness of material is applied. Also, if the material is to be used as a solder mask, the solder mask must possess appropriate physical and chemical properties to withstand the application of the solder material without significant deterioration, degradation or loss of adhesion to the underlying substrate and maintain its coverage over the portions of the board wherein solder is to be masked.

Good photopatternable formulations which permit high resolution fine line photopatterning have been disclosed in the parent application Ser. No. 07/318,536, which issued as U.S. Pat. No. 5,026,624. However, the high resolution fine line photopatterning of such formulations on the conventional "FR4" circuit boards, is limited.

It is desirable to have a liquid photoimagable coating which may be used as a solder mask or a dielectric, or both, containing epoxy resin cured with photosensitive cationic initiators which demonstrate good image resolution on conventional epoxy-glass substrates.

SUMMARY OF THE INVENTION

According to the present invention, good image resolution of a cationically polymerized epoxy based coating, such as a solder mask or dielectric or etch resist, is provided by combining a cationically polymerized epoxy based coating with conventional epoxy glass substrates cured with a curing agent that does not produce alkaline reaction products. Preferably, the coating is photoimagable. The method for making the same is also provided.

It has been discovered that the conventional curing agent, dicyandiamide, which is used to cure the epoxy resin in epoxy-glass substrates, particularly FR4 boards, when used in conjunction with photopatternable coatings containing cationic photoinitiators, limits the image resolution of the coating by causing the coating to detach from the substrate. When non-dicyandiamide curing agents, such as imidazoles or phenolic curing agents, are used to cure the epoxy-glass substrate, the image resolution of such coatings is improved. The coating material includes an epoxy resin system comprising between from about 10% to about 90%, preferably about 28% to about 57% by weight, of a polyol epoxy resin, and from about 10% to about 90%, preferably about 43% to 72% by weight, of a brominated epoxy resin. Preferably the polyol resin is a condensation product of epichlorohydrin and bisphenol A, and preferably has a molecular weight of between about 40,000 and about 130,000. Preferably the brominated resin is an epoxidized glycidyl ether of a brominated bisphenol A resin has a melting point of from about 90° C. and to about 110° C. and a molecular weight of between about 600 and about 2500. Optionally, a third resin, such as a polyepoxy resin, is added to the resin system. The polyepoxy resin is added to increase the crosslinked density of the polymerized solder mask. The polyepoxy resin may be added from an effective amount to less than 20% (25 pph) of the resin system. Optionally, other resins may be added to the epoxy resin system of the coating.

To this resin system is added a cationic photoinitiator capable of initiating polymerization of said epoxidized resin systems upon exposure to actinic radiation.

DETAILED DESCRIPTION OF THE INVENTION

Good image resolution of a cationically polymerable epoxy based coating, such as a solder mask or dielectric or etch resist, is provided by combining a cationically polymerized epoxy based coating with conventional epoxy glass substrates cured with a curing agent that does not generate basic reaction products. Preferably, the coating is photoimagable.

Epoxy-glass substrates are typically made by coating, or "impregnating", glass cloth with the epoxy resin by dipping or otherwise passing the glass cloth through a solution containing epoxy resin and a curing agent, typically dicyandiamide, followed by drying to remove the solvent. The material, known as "prepreg", is made into laminates by subjecting layers of prepreg to heat and pressure which causes the epoxy resin to melt and flow and initiates the polymerization of the epoxy resin by the curing agent. The laminates may be further laminated to form multiple layers. The methods for making circuit boards are known to those skilled in the art. As used herein, the term "circuit board" includes not only circuitized boards, but the precursors to the circuit board as well. At various stages of circuit board manufacture, a photo imagable coating, such as an etch resist, a dielectric or a solder mask, may be employed.

It has been discovered that at certain humidity levels, side reaction products of the dicyandiamide and water interfere with the image resolution of cationically polymerizable epoxy based coatings which are later applied and photoimaged.

It has been found that when the prepreg has been exposed to moisture, epoxy-glass substrate boards cured with dicyandiamide produce significant levels of ammonia and other basic, that is alkaline, contaminants. Specifically, ammonia is produced at significant levels when the prepreg has been equilibrated to an ambient humidity of about 30% relative humiditity (r.h.) or greater. The ammonia is a reaction product of the water and dicyandiamide; the reaction occurs when prepreg, having been exposed to such humidity is then subjected to heat during the lamination of the prepreg. Some ammonia remains in the resulting substrate. In photoimagable cationically polymerizable epoxy based coating materials, the cationic photoinitiators produce acid as a result of being exposed to actinic radiation. The acid initiates polymerization by opening the epoxide ring in the epoxy resin. Once a cationically polymerizable coating is applied to the cured substrate, some of the ammonia and the other basic reaction products (herein free chemical species) remaining in the cured substrate diffuse into the coating and neutralize the acid produced by the cationic photoinitiator. If only a negligible amount of these basic free chemical species are produced, or if a substantial amount of photoinitiator is evenly dispersed, the effect of the basic contaminants may be negligible. However, an appreciable decrease in the available photoinitiator concentration at any given location will lead to a corresponding decrease in the acid available for initiation of polymerization. If the acid concentration drops significantly, basic contaminants from the substrate will neutralize a substantial portion of the acid thereby significantly inhibiting the polymerization of the epoxy resin of the coating. This reaction is increased at the coating substrate interface, because that is the area closest to the substrate that is the source of the ammonia. As a result, the coating detaches and exhibits poor image resolution.

While the coating formulations have been developed to minimize the effect of dicyandiamide, it has been discovered that the reaction products of the conventional curing agent, dicyandiamide, interfere with the image resolution of cationically polymerizable epoxy based coatings. It has been found that replacing the conventional dicyandiamide curing agent with a curing agent that does not generate ammonia or other basic contaminants having a relative basicity greater than the epoxide oxygen in the epoxy resin of the coating greatly increases the image resolution of the photopatternable coating.

The Coating

The coating is specifically adapted for use as a solder mask. However, the coating can be used for other applications, such as an etch resist or a photoimagable dielectric. In one typical solder mask application, the coating is curtain coated by conventional curtain coating techniques onto a substrate to a thickness of about 0.5 to about 4.0 mils or more, dried, photoimaged and developed. The developed areas reveal the desired underlying metallized portions of the substrate wherein solder is to be applied. The remaining solder mask material is cured and remains on the board as a solder mask during the application of solder by any conventional technique. Thus for such an application the system of this invention must have satisfactory rheological properties for application by curtain coating techniques, it must be sensitive to exposure to actinic radiation, which conventionally is in the 330 to 700 nm region, without any significant absorption to thereby allow penetration of the exposure radiation completely through the film; and it must also have the necessary physical and chemical properties to resist degradation during the soldering process. Conventionally, the solder mask remains on the board after soldering and hence for many applications must be fire or flame retardant.

The Coating Resin System

In formulating such a coating there are many competing factors that must be considered in order to provide a desired end product. No specific type of epoxy resin has been found which will satisfy all of the various requirements; however, a formulation of a combination or mixture of various epoxy resins according to this invention provides the required properties for a photoimagable flame retardant solder mask composition.

In general, the epoxy resin system contains two resins. One resin is a polyol resin having epoxy functionality such as, for example, a phenoxy polyol resin of a high molecular weight which is a condensation product of epichlorohydrin and bisphenol A. Suitable resins of this type are sold by Union Carbide Corporation under the Trade Mark "PKHC" and "PKHH". The PKHC has an epoxide value of about 0.03 equivalents per kg, a weight per epoxide of about 37,000, and a Tg (glass transition temperature) of about 98° C. The polyol resin will provide the basis of the necessary rheological and physical properties necessary to curtain coat for solder mask applications.

However, since flame retardancy is desirable for many applications, and the polyol resin does not exhibit adequate flame retardancy, a second resin is added to provide flame retardancy and impart photoactivity. This second resin is a brominated epoxy resin such as, for example, a low molecular weight, high softening point, glycidyl ether of brominated bisphenol A. A suitable resin of this type is an epoxidized diglycidyl ether of tetrabromo bisphenol A, sold by High Tek Polymers Corporation now a division of Rhone-Poulenc under the Trade Mark EpiRez 5183. This resin has an epoxide value of about 1.5 equivalents per kg, a weight per epoxide of about 675, and a melting point of about 97° C.

The two epoxy resins described above, selected to be within certain molecular weight ranges, are blended in certain percentages. It has been found generally that from about 10% to about 90%, preferably about 28% to about 57%, more preferably 36% of the polyol resin is desired with the molecular weight being generally in the range of 40,000 to 130,000, and preferably in the range of 60,000 to 90,000. About 10% to about 90% epoxidized brominated bisphenol A is desirable and more preferably about 43% to about 72% and most preferably about 64% with a molecular weight of generally about 600 to 2,500 and preferably about 1,000 to 1,700 can be used.

Optionally, a third resin, a polyepoxy resin, may be added to the resin system to increase the crosslinked density of the polymerized solder mask, thereby rendering the mask less thermoplastic and more thermoset. Such polyepoxies include, for example, polyfunctional bisphenol A formaldehyde novolak resins having a molecular weight of from about 4,000 to 10,000. Suitable polyepoxy resins of this type include, for example, an octafunctional bisphenol A formaldehyde novolak resin available under the trade name "Epirez SU-8" from High Tek Polymer Corporation. Epirez SU-8 has an epoxide value of 4.7 equivalents per kilogram, a weight per epoxide of 215, and a melting point of 82° C. The polyepoxy resin is added from an effective amount to provide the desired crosslinked density of the polymerized solder mask. The polyepoxy may be added from an effective amount to about 90% of the combined polyol resin and brominated resin, preferably about 25%.

The specific composition is selected to optimize the desired properties. For example, the PKHC controls the rheology of the coated materials, the 5183 imparts flame retardant properties and photospeed to the material, and the polyepoxy resin increases the crosslinked density of the polymerized solder mask.

In selecting the specific amount of each resin it will of course be understood that by increasing the concentration of any one of the resins, this would also increase the respective property associated with it; however, increasing the concentration of any one of the specific resins would require a decrease in the concentration of the remaining resin or resins, which would result in a decrease of the function of the specific properties associated therewith. A decrease in any of the resins below the broad range percentages indicated above would result in properties which are unacceptable for the specific purpose of curtain coatable flame retardant high resolution photoimageable solder mask material.

As the PKHC amount is decreased, the ensuing rheology results in reduced coverage when the material is applied and the resulting material is more brittle. By reducing the 5183, the resulting system has decreased flame retardant characteristics and, if present below the minimum specified broad range, the flame retardant qualities would not meet certain specified industry requirements, e.g. UL 94 VO Flammability Requirements. However, any amount of the 5183 does provide some flame retardant characteristics.

Thus, in balancing the formulation of the material, all of these requirements must be considered and the end product optimized to give satisfactory properties for the result desired.

Optionally, an epoxy cresol novolak resin may be added to the resin system. The epoxy cresol novolak resin is added to increase the photospeed. A suitable resin of this type having an epoxide equivalent weight from about 190 to about 230, and a softening point from about 75° C. to about 95° C., is sold by Dow Chemical Company under the trademark "Quatrex 3710." Another suitable resin of this type having an epoxide equivalent weight of about 235, and a melting point of about 99° C., is sold by Ciba Geigy under the tradename "ECN 1280." The epoxy cresol novolak resin may be added in an amount from about 3 to about 80 parts per hundred (pph) of the total epoxy resin weight. Where the epoxy creosol novolak is the Quatrex, then it is preferably added from about 3 to about 25, more preferably about 10 pph of the total epoxy resin weight. Where the epoxy creosol novolak is the ECN 1280, then it is preferably added at about 50 pph of the total epoxy resin weight.

Another optional resin which may be added to the resin system is a cycloaliphatic difunctional epoxy resin. A suitable resin of this type is 3,4-epoxycyclohexyl-methyl-3,4-epoxy-cyclohexane-carboxylate sold by Union Carbide under the trademark "ERL-4221." This resin has an epoxy equivalent weight of from 131 to about 143, a melting point of 22° C. a specific gravity of 1.18, and an approximate average molecular weight of from about 262 to about 286. Other suitable resins are vinyl cyclohexene dioxide, available under the trade name "ERL-4206" from Union Carbide, 2-(3,4-epoxycyclohexyl-5,5-spiro-3,4-epoxy)cyclohexane-metadioxane, available under the trade name "ERL-4324" from Union Carbide, Bis (3,4-epoxy cyclohexyl) adipate, available under the trade name "ERL 4399" cycloaliphatic resins also available from Union Carbide are "ERL-4200," "ERL 4206" and "ERL 4234" ERL-4299 has a melting point of approximately 20° C. a specific gravity of 1.15 and an epoxy equivalent weight of from about 190 to about 210 and an average approximate molecular weight of from about 380 to 420; ERL-4206 has a melting point of approximately 55° C., a specific gravity of 1.09, an epoxy equivalent weight of from about 70 to about 74 and an average approximate molecular weight of from about 140 to 148; ERL-4234 has a melting point of approximately 0° C., a specific gravity of 1.18, an epoxy equivalent weight of from about 133 to about 154 and an average approximate molecular weight of from about 266 to 318. The cycloaliphatic resins, due to their high reactivity, impart a particularly fast photospeed. The cycloaliphatic resins may also act as plasticizers.

Another such optional resin is a low molecular weight, liquid, difunctional epoxy resin reaction product of bisphenol A and epichlorohydrin. A suitable resin of this type is sold by Shell Oil Company under the trademark "Epon 826." This resin has an epoxide equivalent weight of from about 178 to about 186 and a density of 1.6 grams/cm$^2$. Epon 826 will provide a faster photospeed, and since it is a liquid, it may also act as a plasticizer.

Another optional resin which may be added to the three resin system is polypropylene oxide based on a polyether triol. A suitable resin of this type is sold by Union Carbide under the trademark "LHT-240." This resin has an average approximate molecular weight of about 725, a specific gravity of about 1.02, a hydroxyl number of 233 Mg KOH/g, a viscosity of 270 cP(252), and is a liquid at room temperature. The LHT-240 acts as a plasticizer and/or a processing aid. The ERL 4221 and LHT-240 may be added in an amount up to about 10%, preferably, about 6%.

The Photoinitiator

A photoinitiator such as various sulfonium salts, iodonium salts, and ferrocene salts is added to the resin system for providing the proper photoresponse to actinic radiation. Since the resin system is cationically photocurable, the photoinitiator must be capable of causing cationic polymerization of the resin upon exposure to radiation. One particularly desirable photoinitiator is a complex triarylsulfonium hexafluoroantimonate salt sold by General Electric Company under the Trademark UVE 1014. Other photoinitiators such triphenylsulfonium hexafluorophosphate sold by General Electric Co. under the Trademark UVE 1016, and diphenyliodonium hexafluoroantimate may be used. Additionally, a photosensitizer such as anthracene or its derivatives, or perylene or its derivatives can also be added to increase the response speed of photoimaging and/or the wavelength sensitivity. From about 0.1 and about 15 parts by weight of the photoinitiator based on 100 parts of the resin system are normally what is required and optionally up to about 10 parts by weight of a photosensitizer based on 100 parts of the resin system can be used. (It is conventional practice in the art of formulating to designate the percentage of the components of the resin system to add up to 100% and to designate the additions or additives thereto in values of parts by weight based on 100 parts of the resin system, and this convention is adopted herein.) The resin system, exclusive of the photoinitiator and sensitizer, being further characterized by having an absorbance of light in the 330–700 nm region of less than 0.1 for a 2.0 mil film.

Additives

For some applications, certain additives to the formulation may be desired. For example, a fluorescent or colored dye may be added for inspection or cosmetic purposes. These would be present normally in quantities of about 0.001 to about 1 part per 100 by weight. Examples of these types of dyes that may be used are malachite green oxalate, ethyl violet and rhodamine B. Additionally for some coating applications, it may be desirable to use a surfactant as a coating aid, for example a fluorinated polyether such as Fluorad FC 430 sold by 3M Corp. The Surfactant will normally be present in quantities of 0.01 to 1 part per 100 by weight. If desired, a thixotropic agent such as amorphous silicon dioxide or fumed silica can be added to adjust the rheology of the material to enable it to be flood screen applied or screen applied through a pattern. It will, of course, be understood that the additive must not significantly degrade the other properties of the coating.

Coating Formulation 1

A photopatternable coating was made by combining 30.0% PKHC 45.0% Epirez 5183, and 25% Epirez SU-8, with 5 parts by weight of the UVE 1014 photoinitiatior and 0.07 parts per hundred resin parts (pph) of ethyl violet dye and 0.03 pph of the surfactant FC430. The material was then mixed in a propylene glycol monomethyl ether acetate solvent to provide a solids content of about 40%. Unless otherwise noted, this formulation of example 1 is the coating used in following experiments.

Coating Formulation 2

A second photopatternable coating was made by combining 36% PKHC and 64% Epirez 5183 with 5 parts by weight of UVE 1014 photoinitiatior, and 0.07 parts per hundred resin parts, of ethyl violet dye and 0.03 parts per hundred resin parts, of the surfactant FC430. The material was then mixed in a propylene glycol monomethyl ether acetate solvent to provide a solids content of about 40%.

Each coating formulation was mixed in a solvent, either propylene glycol monomethyl ether acetate (PGMEA) or methyl ethyl ketone (MEK), these formulations being about 35–50% solids in the solvent. Other moderately polar solvents can be used such as propylene glycol monomethyl ether, 2-methoxyethanol, 2-methoxyethyl acetate, 2-ethoxyethyl acetate, N-methyl pyrrolidone, propylene carbonate, or gammabutyrolactone.

The Substrate

The substrate is preferably an epoxy-glass substrate comprised of an epoxy resin and fiberglass cloth. Any glass cloth suitable for producing circuit boards may be used; a number of suitable cloths are available commercially. 1080 Glass Cloth used in the examples was purchased from Clark-Schwebel Fiberglass Corp., in Anderson, S.C.; 105 Glass Cloth and 109 Glass Cloth were both purchased from Clark-Schwebel in Statesville, N.C.. Also 104, 105, 109, 106, 7628, 2116, 108, 112, 2112, 116, 1080, 1675, and 7628 glass cloth may be purchased from Burlington Glass Fabrics in Altavista, Virginia; Interglass in Germany, Porshe in France; J.P. Stevens & Company, Inc. in New York, N.Y. and Clark-Schwebel. Commercially available cloths are typically supplied with coupling agents which promote adhesion between the substrate resin and glass cloth. Such coupling agents are proprietary, and may be ordered when ordering the cloth. Preferred coupling agents are CS 718 and CS 426 with the 8212 resin and either CS 440, I639 or CS 426 with the 9302 resin.

The Substrate Resin

A number of epoxy resins are suitable for use in the substrate, such as, for example, the resin available from Ciba Geigy under the designation "XU8212" (hereinafter "8212"). The precise chemical composition of the 8212 is proprietary. The 8212 has a weight per epoxide of about 435–500, 70% solids, and contains an epoxy creosol novolak resin designated "ARALDITE ECN 1280" commercially available from Ciba Geigy. The ECN 1280 is an polyepoxy resin which is a reaction product of an orthocreosol formaldehyde novolak resin and epichlorohydrin, and has a weight per epoxide typically of about 230, an average molecular weight of about 1170 and a melting point of 80° C.

Another suitable resin, also available from Ciba Geigy, is commercially available under the designation "LZ 9302" (hereinafter "9302"). The 9302 resin contains 71% solids in methyl ethyl ketone, and is comprised of a mixture of low molecular weight polymer of diglycydl ether of bisphenol A designated ARALDITE LT 8011 and the ECN 1280 resin. The precise chemical composition of the 9302 resin is proprietary. The 9302 resin may be obtained from the manufacturer dispersed in a solvent other than methyl ethyl ketone, such as for example acetone.

Another suitable resin is "XUS 71966.00L" (hereinafter 71966) from Dow Chemical Company which contains 70% solids in methyl ethyl ketone, and has a weight per epoxide typically of about 352. The 71966 resin is a mixture of two resins, 17 weight % of a polymer that is the reaction product of phenol and formaldehyde, and 51 weight % of a polymer that is the reaction product of a phenol formaldehyde resin and epichlorohydrin. The remaining 32 weight % is curing agent. The 71966 resin may also be obtained from the manufacturer dispersed in a solvent other than methyl ethyl ketone, such as for example acetone.

Other suitable resins include: "Quatrex 5010" a blend of Tris(hydroxyphenyl) methane epoxy novolak resin and a phenolic curing agent, from Dow Chemical Company; "Epon 1212" an epoxy resin having a weight per epoxide of 545 to 565, available from Shell Chemical Company, and "Epon 1151" an epoxy resin having a weight per epoxide of 345 to 375, available from Shell Chemical Company; and "ECN 1235", "ECN 1273", and "ECN 1299" polyepoxy resins which are reaction products of orthocreosol formaldehyde novolak resin and epichlorohydrin, from Ciba Geigy. Resins which require dicyandiamide as a curing agent are not suitable.

Curing Agents

Suitable curing agents to be used in the present invention are non-dicyandiamide curing agents. Suitable curing agents are known in the art and include phenolic curing agents, and imidazols such as, for example, 2-methylimidazol ("2MI") from BASF Corporation, and 2-ethyl,4-methylimidazol ("2,4 EMI"); both are available from Aldrich Chemical Company. (Although 2 MI participates in the curing reaction, it is sometimes referred to in the art as an accelerator.) Other suitable curing agents include anhydride curing agents such as those identified in Chapter 4 of "Epoxy Resins—Chemistry and Technology," Second Edition, edited by C. A. Mory, published by Marcel Dekker Inc., ©1988, polymercapton curing agents, such as, for example those identified in Chapter 4 of "Epoxy Resins," and polyphenol curing agents, such as, for example bisphenol A, and those curing agents disclosed in Chapter 4 of "Epoxy Resins."

The 8212 Resin and the 71966 resin are provided with a tetrabromo bisphenol A curing agent by the manufacturer. In addition to the curing agents provided by the manufacturer of the resin, other curing agents can be added.

Accelerators

Certain resins may require the presence of accelerators. The 9302 resin requires an accelerator such as, for example, tetramethyl butanediamine (TMDBA) or Benzyldimethylamine (BDMA) available from Aldrich Chemical Company and Anchor Pacific Inc. The use of accelerators is known to one skilled in the art.

Preparation of the Epoxy Glass Substrate

The substrate resin package, which is typically obtained already dissolved in solvent and with a curing agent, is mixed with any additional curing agents and accelerators and MEK. Next the glass cloth is run through the resin mix and metered by rollers to obtain a web of even thickness. The web is then oven dryed at about 120°–180° C. until the resin just begins to polymerize and the web is dry and tack free. The web is cut into sheets of desired sizes to provide "prepreg". Thereafter, the prepreg is sandwiched in between metal or other conducting layers and compressed in a laminating press at about 175° C. for about 2 hours, depending on the lamination equipment, to provide a product such as a "NIP" or a "core". Such techniques for the preparation of epoxy glass substrates are known in the art.

As used herein the term "epoxy glass substrate" includes prepreg, metallized prepreg, NIPs, laminates and all other epoxy glass materials used or made in the manufacturing of circuit boards.

Evaluation of the Coating on Cured Substrate

Substrates containing prepreg cured with dicyandiamide and substrates containing prepreg cured with a curing agent other than dicyandiamide were evaluated in combination with the coatings described above. Each substrate in the following examples was coated with the coating of formulation 1 or formulation 2 using a number 75 wound wire rod then air dryed for about 20 minutes and oven dryed for about 10 minutes at about 125° C. Both of the formulations coated very well onto the substrate using the wound wire rod. The coating was then exposed to 1350 millijoules/cm$^2$ UV radiation from a medium pressure mercury lamp. The UV radiation was passed through a diazo phototool test pattern which is opaque in those areas where the solder mask is to be removed. A Stauffer 21 step wedge was placed underneath a clear portion of the phototool. After exposure to UV radiation, the circuit boards were baked for 15 minutes at 125° C. to accelerate the crosslinking reaction initiated by the sulfonium salt photolysis products. Bake temperatures between 100° C. and 150° C. and times between 2 and 15 minutes were used. The solder mask was then developed with butyrolactone for about 90 seconds at about 20 psi spray pressure to dissolve any unexposed material. Curing of the solder mask was accomplished by exposing the solder mask to about 2 joules/cm$^2$ UV radiation followed by an oven bake at about 150° C., for about 60 minutes.

EXAMPLES 1 AND 2

Samples of substrates were cut to 10×15 inch panels and coated with coating formulation 1. The results are shown in Table I. The experiment was repeated, the results are shown in Table II.

TABLE I

| | | | | Step Held | | | |
|---|---|---|---|---|---|---|---|
| EX | GLASS CLOTH | RESIN | CURING AGENT pph | Outside Diazo (mils) | Under Diazo (mils) | Min. Line Held (mils) | Haze (mils) |
| 1 | 1080 | 9302[1] | DICY 3.0 | 5.8 | 2.9 | 1.00 | .7070 |
| 2 | 1080 | 9302[2] | DICY 3.0 | 5.0 | 2.0 | 2.0 | .5178 |
| 3 | 1080 | 8212 | 2MI 0.125, | 6.0 | 4.0 | 1.0 | .1010 |

TABLE I-continued

| EX | GLASS CLOTH | RESIN | CURING AGENT pph | Step Held Outside Diazo (mils) | Step Held Under Diazo (mils) | Min. Line Held (mils) | Haze (mils) |
|---|---|---|---|---|---|---|---|
| 4 | 1080 | 71966 | TBBA 2MI 0.096, TBBA | 7.0 | 4.9 | 1.0 | .1717 |
| 5 | 1080 | 9302 Cont. | DICY 3.0 | 5.0 | 2.0 | 2.5 | 1.060 |

1: Approximately 60 mil thick
2: Approximately 10 mil thick
DICY — Dicyandiamide curing agent - at 3 pph
pph — parts per hundred resin parts
NOTE: Examples 1 and 5 may not have had full 90 second developing time and thus the reported haze value may be artifically low.
Haze — amount of undercutting
TBBA — tetrabromobisphenol A curing agent provided by the manufacturer

TABLE II

| Ex | CLOTH | Resin | Curing Agent pph | Step Held Outside Diazo (mils) | Step Held Under Diazo (mils) | Min. Line Held (mils) | Haze (mils) |
|---|---|---|---|---|---|---|---|
| 1A | 1080 | 9302[1] | DICY 3.0 | 5.4 | 2.1 | 1.5 | .8304 |
| 2B | 1080 | 9302[2] | DICY 3.0 | 5.0 | 2.0 | 1.5 | .7297 |
| 3C | 1080 | 8212 | 2MI 0.125, TBBA | 6.0 | 3.0 | 1.0 | .1010 |
| 4D | 1080 | 71966 | 2MI 0.096, TBBA | 7.0 | 4.3 | 1.0 | .1205 |
| 5E | 1080 | 9302 Cont. | DICY 3.0 | 5.6 | 3.0 | 1.5 | 1.0130 |

1: Approximately 60 mil thick
2: Approximately 10 mil thick
NOTE: example number 3 was exposed through a reversed diazo.
pph: parts per hundred resin parts
Haze — amount of undercutting
DICY — dicyandiamide
TBBA — tetrabromobisphenol A curing agent provided by the manufacturer

EXAMPLE #3

Different amounts of substrate resin were combined with the glass cloth to provide substrates of varying thickness. Both coating formulations were evaluated. The results are shown in Table III.

TABLE III

| EX | RESIN | C | COATING | CURING AGENT | Step Held Outside Diazo (mils) | Step Held Under Diazo (mils) | Min. Line Held (mils) | Haze (mils) |
|---|---|---|---|---|---|---|---|---|
| 1 | 8212 | S | Form. 1 | TBBA | 7.0 | 4.0 | 1.0 | .3750 |
| 2 | 8212 | R | " | 2MI, TBBA | 6.9 | 4.0 | 1.0 | <.10 |
| 3 | 71966 | S | " | 2MI 0.096, TBBA | 7.0 | 4.3 | 1.0 | .4877 |
| 4 | 71966 | R | " | 2MI 0.096, TBBA | 7.0 | 4.1 | 1.0 | <.10 |
| 5 | $9302^L$ | S | " | DICY | 5.0 | 2.0 | 4.0 | 1.5176 |
| 6 | $9302^L$ | R | " | DICY | 5.0 | 2.0 | 3.5 | 1.1576 |
| 7 | $9302^H$ | S | " | DICY | 5.0 | 2.0 | 4.0 | 1.4994 |
| 8 | $9302^H$ | R | " | DICY | 5.0 | 2.0 | 3.5 | 1.3229 |
| 9 | 9302 | R | " | DICY | 5.8 | 2.8 | 2.5 | 1.0597 |
| 10 | 8212 | S | Form. 2 | 2MI 0.125, TBBA | 11.3 | 9.0 | 1.5 | <.10 |
| 11 | 8212 | R | " | 2MI 0.125, TBBA | 12.0 | 9.0 | 1.0 | <.10 |
| 12 | 71966 | S | " | TBBA | 12.0 | 9.3 | 1.0 | * |
| 13 | 71966 | R | " | TBBA | 11.6 | 9.0 | 1.0 | * |
| 14 | $9302^L$ | S | " | DICY | 8.8 | 5.2 | 3.0 | <.10 |
| 15 | $9302^L$ | R | " | DICY | 8.3 | 5.3 | 2.5 | * |
| 16 | $9302^H$ | S | " | DICY | 9.0 | 5.2 | 3.0 | <.10 |

TABLE III-continued

| EX | RESIN | C | COATING | CURING AGENT | Step Held Outside Diazo (mils) | Under Diazo (mils) | Min. Line Held (mils) | Haze (mils) |
|---|---|---|---|---|---|---|---|---|
| 17 | 9302[H] | R | " | DICY | 8.0 | 5.0 | 2.0 | <.10 |
| 18 | 9302 Cont. | | " | DICY | 9.0 | 6.0 | 2.0 | * |
| 19 | 9302 | | " | DICY | 5.0 | 1.3 | 2.5 | 1.0789 |
| 20 | 9302 | | " | DICY | 5.0 | 1.9 | 3.0 | <.10 |

C — Side of copper foil to prepreg
R — Rough side
S — Smooth side
*Data not available
H — High pickup approximately 60–63% resin
L — Low pickup approximately 51–54% resin
pph — parts per hundred resin parts
DICY — dicyandiamide at 3 pph resin parts
Haze — amount of undercutting
TBBA — tetrabromobisphenol A curing agent provided by the manufacturer

EXAMPLE #4

All samples were coated with coating formulation number 1. However, different glass clothes were compared.

EXAMPLE #5

All substrate samples used 1080 glass cloth and were coated with formulation 1.

TABLE V

| EX | RESIN | ACC (pph) | CURING AGENT (pph) | Step Held Outside Diazo (mils) | Under Diazo (mils) | Min. Line Held (mils) | Haze (mils) |
|---|---|---|---|---|---|---|---|
| 1 | 9302 | BDMA 0.4 | DICY 3.0 | 6.0 | 3.4 | 1.5 | 1.03 |
| 2 | 9302 | TMBDA 0.3 | 2MI 1.0 | 6.0 | 3.4 | 2.5 | <.20 |
| 3 | 9302 | NONE | 2MI 0.15 DICY 3.0 | 6.1 | 4.1 | 1.5 | .48 |
| 4 | 9302 | TMBDA 0.3 | DICY 3.0 | 6.1 | 3.7 | 2.5 | .50 |
| 5 | 9302 CONT. | TMBDA 0.24 | DICY 3.0 | 5.5 | 2.8 | 2.0 | 1.15 | pph — parts per hundred resin parts
ACC — accelerator
Haze — amount of undercutting The coated substrates were evaluated for the minimum line width and the degree of undercutting present on a line of coating. The exposure dose was monitored

TABLE IV

| EX | CLOTH | RESIN | ACC. (pph) | SOLVENT (pph) | CURING AGENT (pph) | STEP HELD OUTSIDE DIAZO (mils) | UNDER DIAZO (mils) | Min. Line HELD (mils) | HAZE (mils) |
|---|---|---|---|---|---|---|---|---|---|
| 1 | 1080 | 9302 CONTROL | TMBDA 0.24 | EGME 50 | DICY | 5.0 | 2.0 | 4.5 | 1.38 |
| 2 | 1080 | 9302 | TMBDA 0.24 | EGME 37 | DICY | 4.6 | 1.7 | 5.0 | 1.94 |
| 3 | 109 | 9302 | — | MEK 35 | 2,4EMI 1.0 | 5.6 | 3.0 | 1.0 | <.1 |
| 4 | 109 | 8212 | — | MEK 35 | 2MI 0.13, TBBA | 6.1 | 4.0 | 1.0 | <.1 |
| 5 | 105 | 9302 | TMBDA 0.24 | EGME 50 | DICY | 4.5 | 1.8 | 4.5 | 1.58 |
| 6 | 105 | 9302 | TMBDA 0.24 | EGME 50 | DICY | 4.0 | 2.0 | 4.5 | 1.74 |
| 7 | 105 | 9302 | TMBDA 0.24 | EGME 37 | DICY | 4.0 | 1.7 | 5.0 | 1.47 |
| 8 | 105 | 9302 | TMBDA 0.24 | EGME 37 | DICY | 4.0 | 1.0 | 4.5 | 1.57 |
| 9 | 109 | 9302 Cont. | TMBDA 0.24 | EGME 37 | DICY | 5.9 | 3.2 | 1.5 | .99 | pph — parts per hundred resin parts
Haze — amount of undercutting
TBBA — tetrabromobisphenol A curing agent provided by the manufacturer using a Stauffer 21 step wedge which was placed under the diazo phototool. The higher the step wedge value, the more sensitive the coating is to the UV light. Accordingly, example 4 in Table IV which has a value of 6.1, is about two times as fast as example 6, which has a value of 4, for the same exposure dose. In Tables I, and Table II, the nondicyandiamide cured examples, that is examples 3 and 4, displayed better photospeed than the dicyandiamide cured substrates. Similarly in Tables III-VI the non-dicyandiamide cured examples have exhibited satisfactory photo speed.

The "minimum line held" represents the minimum coating line width achievable with a particular formulation; it is a measure of resolution. If the undercutting is severe enough, a line will be completely undercut so that it is washed away upon development. A coating which can produce minimum line widths of 2.0 mils. or less is desirable. To evaluate the line held, a test pattern with a different widths of lines ranging from 1.0 mil to 5.0 mil. was used to photoimage the coating. A total of 28 lines are imaged for each line width. The minimum line width held is that minimum line width for which all 28 lines are present along their entire length. As can be seen in Tables I and II, examples 3 and 4, the nondicyandiamide cured substrates, achieved better image resolution than dicyandiamide cured substrates with the exception of example 1 which achieved comparable resolution. Similarly, the non-dicyandiamide cured examples in Tables III–VI also show good minimum line held values.

The Tables also contain values for the amount of undercutting along a line of coating. The edges of an undercut line of coating display a hazy, whitish color when optical microscopy is employed for evaluation. This haze extends inward from the edge of the line for a distance that corresponds to the amount of undercutting below the line surface. This haze may be measured at several points over the length of a line and averaged. It is desirable to have 0.5 mil. or less of undercutting along a line of coating. In Tables I and II, examples 3 and 4, the non-dicyandiamide cured substrates, display significantly less haze, that is, undercutting than the dicyandiamide cured substrates. Similarly, the results in Tables III–VI show that the coating on non-dicyandiamide cured substrate exhibits significantly less haze than the coating or dicyandiamide cured substrate.

The data in Tables I–VI shows that in general the coating formulations of the present invention on substrate not containing dicyandiamide display higher step held and smaller line held values than the same coating processed in the same manner to substrates cured with dicyandiamide.

Practice of the Invention

First a non-dicyandiamide cured substrate is obtained commercially or by manufacturing by processes known to one skilled in the art, and as described above. The coating composition is coated onto the substrate then dried to remove the solvent. While drying processes are known to one skilled in the art, it has been found that about 20 minutes at about 20° to 30° C. followed by about 10 to about 20 minutes at about 125° C. works well. The composition is then photoimaged by exposing it to actinic radiation through a phototool. The composition is then baked at about 80°–140° C. for about 5 to 20 minutes, and then developed. Next the composition is cured by exposing it to UV light from about 1 to 6 Joules/cm$^2$, preferably 2 Joules/cm$^2$ and baking in an oven for about 30 minutes to about 90 minutes preferably about 50 minutes at from about 130° to about 160° C., preferably about 150° C.

Where the coating is to be used as a solder mask, surface oxides on the metallic conductors of the circuit substrate should be removed such as with a dilute HCl rinse after the coating is applied. After applying an antioxidant such as benzotriazole, circuit boards can be soldered using a variety of methods. Two of the processes used with solder mask described here are wave solder and vapor phase solder. Wave solder involves placing components onto the circuit board, coating the metallic surfaces to be soldered with a flux and passing this assembly through a continuously flowing wave of molten solder. Vapor phase solder is accomplished by applying a solder paste comprised of a flux and solid solder to the exposed metallic surfaces on the board by screening or some other appropriate technique. After placing components on the board the assembly is passed through a vapor which is maintained at a temperature above the melting point of the solder.

This invention has been described specifically as a formulation for solder mask material, suitable for use on non dicyandiamide cured substrates. However, it can be used for other purposes such as, a protective coating or an etch resist.

Where different uses and coating techniques are employed, certain modifications of the preferred material and process may be necessary to meet different requirements. For example, a different solvent may be desired for roller coating or screen coating as opposed to curtain coating and the rheological properties may be varied from the optimum for curtain coating for the different types of uses.

While the invention has been described with a certain degree of particularity, various adaptations and modifications can be made without departing from the scope of the invention as defined in the appended claims.

We claim:

1. A circuit board comprising:
   A. a cured epoxy glass substrate;
   B. a patterned cationically polymerized epoxy resin coating disposed on said substrate, comprising an epoxy based resin system having solids comprising:
      i. between about 10% and about 90% by weight of a polyol resin;
      ii. between about 10% and about 90% by weight of a brominated epoxy resin;
   wherein said substrate is essentially free of free chemical species having a relative basicity greater than the basicity of the epoxide oxygen in said epoxy resin.

2. The invention of claim 1, wherein the epoxy resin coating is photocurable.

3. The invention of claim 1, wherein the
   polyol resin has a molecular weight of between about 10,000 to about 130,000; and
   the brominated epoxy resin has a molecular weight of between about 600 and about 2,500; and the coating further comprises:
   b. from about 0.1 to about 15 parts by weight of a cationic photoinitiator capable of initiating polymerization in said epoxidized resin system upon exposure to actinic radiation,
      said resin system being further characterized by having an absorbance of light in a 330 to 700 nm region of less than 0.1 for a 2 mill thick film.

4. The invention as defined in claim 3, further comprising from an effective amount to about 90% of a polyepoxy resin having a molecular weight of between about 4,000 to about 10,000.

5. The invention as defined in claim 4, further comprising from an effective amount to about 80 pph of the resin weight, of an epoxy creosol novolak resin having an average molecular weight of between about 1000 to about 1500.

6. The invention as defined in claim 4, wherein there is about 30% polyol resin; about 45% of the brominated epoxy resin; and about 25% polyepoxy resin; and about 5 parts by weight of sulfonium salt initiator.

7. The invention as defined in claim 1, wherein there is about 36% polyol resin; about 64% of the brominated epoxy resin; about 5 parts by weight of the sulfonium salt initiator.

8. The invention as defined in claim 1, further characterized by from an effective amount up to about 40% by weight of a low molecular weight, liquid, difunctional epoxy resin.

9. The invention as defined in claim 3 wherein the epoxy glass substrate is comprised of an epoxy creosol novolak resin having a weight per epoxide of about 435-500.

10. The invention as defined in claim 9, wherein the epoxy glass substrate further comprises a reaction product of a low molecular weight polymer of diglycidl ether of bisphenol A with tetrabromobisphenol A; having a weight per epoxide of about 450 to about 500.

11. The invention as defined in claim 1, wherein the epoxy glass substrate comprises a mixture of: the reaction product of phenol and formaldehyde; and the reaction product of phenol formaldehyde resin and epichlorohydrin.

12. The invention as defined in claim 1, wherein the coating is further characterized by an effective amount of a thixotrope.

13. The invention as defined in claim 1, wherein the coating is further characterized by an effective amount of a low molecular weight polyol to act as a plasticizer.

14. The invention as defined in claim 1, wherein the epoxy glass substrate is cured with an imidazole curing agent.

15. The invention as defined in claim 14, wherein the imidazol is 2-methylimidazol.

16. The invention as defined in claim 14, wherein the imidazol is 2-ethyl,4-methylimidazol.

17. The invention as defined in claim 1 wherein the epoxy glass substrate is cured with a curing agent which comprises tetrabromo bisphenol A.

18. A method for preparing a circuit board comprising the steps of:
  a. providing a cationically polymerizable coating comprising an epoxy based resin system having solids comprising:
    i. between about 10% and about 90% by weight of a polyol resin;
    ii. between about 10% and about 90% by weight of a brominated epoxy resin; and a cationic photoinitiator;
  b. providing a substrate, wherein the substrate is essentially free of free chemical species having a relative basicity greater than the basicity of the epoxide oxygen in said resin;
  c. applying the coating to the substrate;
  d. then polymerizing the coating.

19. The method of claim 18, further comprising the steps of exposing the coating to actinic radiation, then developing the coating, and then curing the coating.

20. The method of claim 18, further comprising the steps of exposing the coating to actinic radiation through a phototool, then developing the coating.

21. A circuit board produced by the process defined in claim 18.

22. A circuit board comprising:
  a. a cationically polymerized epoxy resin coating comprising an epoxy based resin system having solids comprising:
    i. between about 10% and about 90% by weight of a polyol resin;
    ii. between about 10% and about 90% by weight of a brominated epoxy resin;
  b. a cured epoxy glass substrate, comprising:
    (i) at least one curing agent; and
    (ii) epoxy glass substrate;
  wherein said substrate is essentially free of dicyandiamide or the reaction products thereof, and said substrate is essentially free of free chemical species having a relative basicity greater than the basicity of the epoxide oxygen in said resin.

* * * * *